United States Patent [19]
Ross

[11] Patent Number: 5,270,591
[45] Date of Patent: Dec. 14, 1993

[54] CONTENT ADDRESSABLE MEMORY ARCHITECTURE AND CIRCUITS

[75] Inventor: Mark A. Ross, San Carlos, Calif.

[73] Assignee: Xerox Corporation, Stamford, Conn.

[21] Appl. No.: 843,683

[22] Filed: Feb. 28, 1992

[51] Int. Cl.[5] .................... H03F 3/45; H03K 5/153
[52] U.S. Cl. ........................... 307/530; 307/362; 307/272.3; 330/288
[58] Field of Search .............. 307/530, 362, 272.3; 330/288

[56] References Cited

U.S. PATENT DOCUMENTS

| | | | |
|---|---|---|---|
| 3,949,381 | 4/1976 | Dennard et al. | 340/173 CA |
| 4,010,453 | 3/1977 | Lewis | 340/173 R |
| 4,039,861 | 8/1977 | Heller et al. | 307/355 |
| 4,195,239 | 3/1980 | Suzuki | 307/355 |
| 4,239,994 | 12/1980 | Stewart | 307/359 |
| 4,247,791 | 1/1981 | Rovell | 307/355 |
| 4,471,244 | 9/1984 | Maples | 307/530 |
| 4,513,209 | 4/1985 | Tanabe et al. | 307/350 |
| 4,528,646 | 7/1985 | Ochii et al. | 365/203 |
| 4,584,493 | 4/1986 | Lee | 307/530 |
| 4,604,533 | 8/1986 | Miyamoto et al. | 307/530 |
| 4,625,300 | 11/1986 | McElroy | 365/205 |
| 4,636,665 | 1/1987 | McLaughlin | 307/530 |
| 4,651,036 | 3/1987 | Tallaron | 330/288 |
| 4,658,159 | 4/1987 | Miyamoto | 307/530 |
| 4,710,901 | 12/1987 | Kumanoya et al. | 365/190 |
| 4,841,486 | 6/1989 | Minato et al. | 365/207 |
| 4,947,376 | 8/1990 | Arimoto et al. | 365/205 |

OTHER PUBLICATIONS

Rosseel, G. O., et al., "A Single-Ended BiCMOS Sense Circuit for Digital Circuits," IEEE International SOlio-State Circuits Conference, 2 pp., (1989).

Primary Examiner—Margaret R. Wambach
Attorney, Agent, or Firm—Townsend and Townsend Khourie and Crew

[57] ABSTRACT

A BICMOS sense amplifier for content addressable memory circuits which combines the low power dissipation and high noise immunity of CMOS devices while maintaining the high drive capability and switching speed associated with bipolar devices. A combination of an RS latch at the output of a bipolar sense amplifier storing this output, and a clamping device at the base of the bipolar sensing amplifier shorting the base to ground, bring the bipolar device out of saturation after each sensing cycle to improve the switching speed. A biasing network is designed to bring the base of the bipolar sense amplifier up to a base-emitter turn-on voltage, while maintaining the output at a high level to improve voltage sensitivity and switching speed. Current mirrors are used in the biasing network to optimize performance over temperature and process variations.

10 Claims, 2 Drawing Sheets

CONTENT ADDRESSABLE MEMORY ARCHITECTURE AND CIRCUITS

BACKGROUND OF THE INVENTION

The present invention relates to a BICMOS Content Addressable Memory sense amplifier that combines the high drive capability and switching time of bipolar devices with the low noise and power dissipation of CMOS devices.

Content Addressable Memories (CAMs) consist of rows of CAM cells. Typically, each CAM cell consists of a static Random Access Memory (RAM) cell to store a data bit, paired with a comparator to determine bit-wise matching between stored data and input data. The compare logic within each CAM cell determines a response of the cell output. For example, the convention employed for the CAM cells of the following description is: when an input bit does not match with the stored bit in a cell, the output of that cell is pulled high, and when there is a match the output remains low. The outputs of all cells in each row connect to a single match line, and each match line is fed into a sense amplifier whose function is to detect a word match. Therefore, during each cycle an input word is clocked in and gets compared to every row of the CAM. In each case where there is a non-matching bit, the match line for that entire row is pulled high. A match line that has not changed indicates a match between all bits of the input word and the contents of that particular CAM row.

FIG. 1 illustrates an interaction of a CAM row on the match line. Each cell is capable of providing some current onto the match line. In FIG. 1 the match line is labeled match to identify that a match indication in the described circuit results from a "low" voltage signal on the match line. Current or voltage sensing detects this current. Regardless of the sensing method, several features remain consistent: the match line has a high relative capacitance since it is shared by all cells in a row; the gain of the sense amplifier is large to achieve high speed; the amplifier is relatively small and consumes relatively low power since many will be active simultaneously.

Designers combine bipolar transistors to perform the sensing with CMOS devices for loads and biasing network to meet the above requirements. An exponential relationship between a base-emitter voltage and a collector current of a bipolar transistor allows for very fast sensing. Also, due to higher transconductance, bipolar transistors make superior amplifiers compared to MOS devices The higher transconductance makes the bipolar transistors more sensitive to small voltage variations at their input. At the same time, use of CMOS transistors for a remainder of the sense amplifier circuit reduces the noise, power dissipation, and size of the circuit.

Typical applications for CAMs are in devices such as catalog memories where a CAM interfaces with a RAM array. In order for the sense amplifier to interface to a row line driver of one of these RAM arrays, it must provide CMOS voltage levels. Designers achieve CMOS voltage levels by either designing an amplifier with a low output voltage swing followed by a voltage level translation to CMOS levels, or by performing level translation and sensing in one stage. The first method slows down the detection time since fast level translation circuits are difficult to design. The second method requires the collector voltage of the bipolar device (output of the amplifier) to swing full CMOS levels which produces saturation of the bipolar device. Since switching times of bipolar devices increase significantly in their saturation region, avoiding saturation requires additional complicated circuitry.

Furthermore, the base-emitter voltage of a bipolar transistor has a negative temperature coefficient while the threshold voltages of the MOS devices do not. Therefore temperature and process shifts would either make a CMOS biasing network for the bipolar amplifier nonfunctional, or require sufficient safety margins to limit its applications.

SUMMARY OF THE INVENTION

It is accordingly an object of this invention to provide an improved BICMOS content addressable memory sense amplifier having high speed operation.

Another object of the present invention is to provide an improved BICMOS content addressable memory sense amplifier with high voltage sensitivity.

A further object of the present invention is to provide an improved BICMOS content addressable memory sense amplifier having low power dissipation and improved performance over temperature and process variations.

In carrying out the above and other objects of the invention in one form, there is provided a BICMOS sense amplifier for Content Addressable Memory circuits used in a clocked system having a "desaturating" scheme and a BICMOS biasing network.

A "desaturating" circuit brings the bipolar sensing transistor out of saturation after completion of each sensing cycle. This allows for a CMOS level voltage swing, while maintaining a fast switching time for the next sensing cycle.

A BICMOS biasing network utilizes a bipolar current mirror for better tracking over temperature and process shifts. CMOS devices provide the loads for the bipolar amplifier and current mirror biasing network. A proper ratioing of the sizes of these load devices raises the voltage level at the base of the sensing bipolar transistor, closer to the base-emitter turn-on voltage, while maintaining a high level at the collector of the bipolar transistor. This increases the voltage sensitivity of the sense amplifier, since it is biased such that only a very small voltage variation will cause the switching of the bipolar amplifier.

DESCRIPTION OF THE PREFERRED EMBODIMENT

Figure 1:
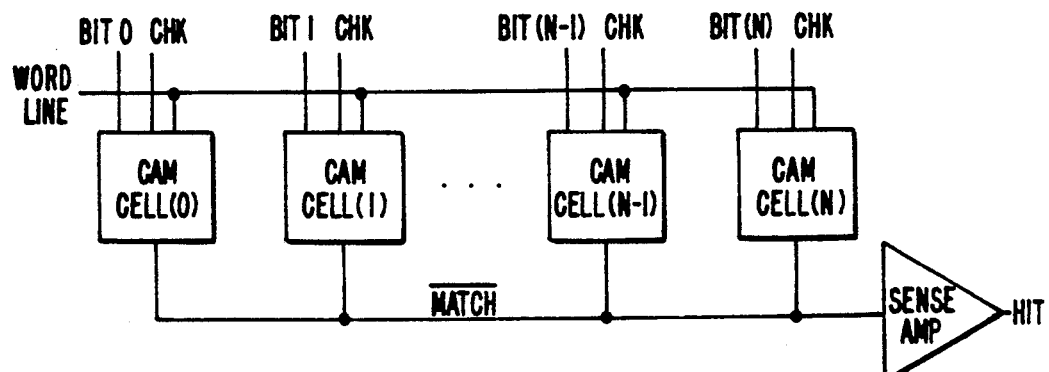
FIG. 1 is a block diagram of a single CAM row.
Figure 2:
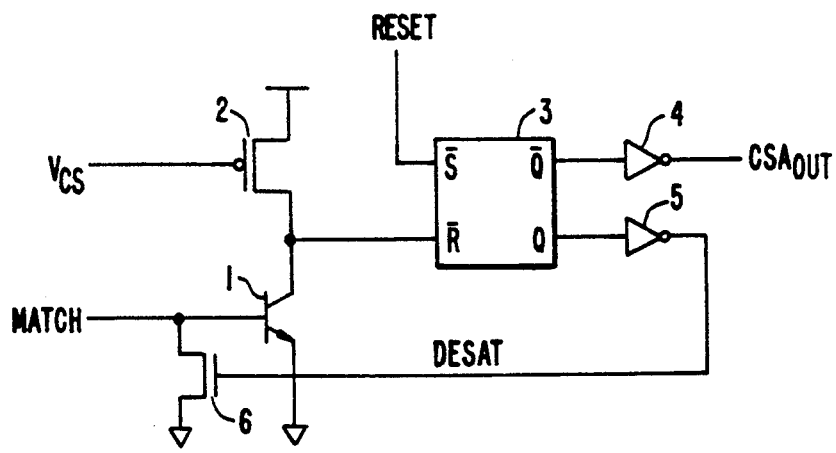
FIG. 2 is a circuit diagram of a bipolar sense amplifier with desaturating network.

FIG. 2 is a circuit diagram of a bipolar amplifier with clamp circuitry in accordance with the present invention. A bipolar transistor 1 senses a match signal at its base input with its collector coupled to a drain of a P-channel MOS load transistor 2. A current-source voltage drives a gate of the load transistor 2. The collector of the bipolar transistor 1 is coupled to a reset input of an R/S latch 3 with active low inputs. A set input of the latch 3 is coupled to a RESET input signal. A complementary output $\bar{Q}$ of the latch 3 is coupled to an input of inverter 4. An output of inverter 4 is the output of the CAM Sense Amplifier (CSAout). The match line at the base of the bipolar transistor 1 is also connected to a drain of an N-channel MOS clamping transistor 6. A source of the clamping transistor 6 is coupled to a ground terminal, while its gate is driven by an output of a second inverter 5. An input of the second inverter 5 is coupled to an output Q of latch 3.

For the collector voltage of the bipolar transistor 1 to swing full CMOS levels, the bipolar transistor 1 will have to enter the saturation region. Since once in the saturation region the switching time for the bipolar transistor 1 is greatly increased, the circuit of FIG. 2 provides a mechanism which brings the bipolar transistor 1 out of saturation ("desaturate") prior to the next sensing cycle.

Figure 3:
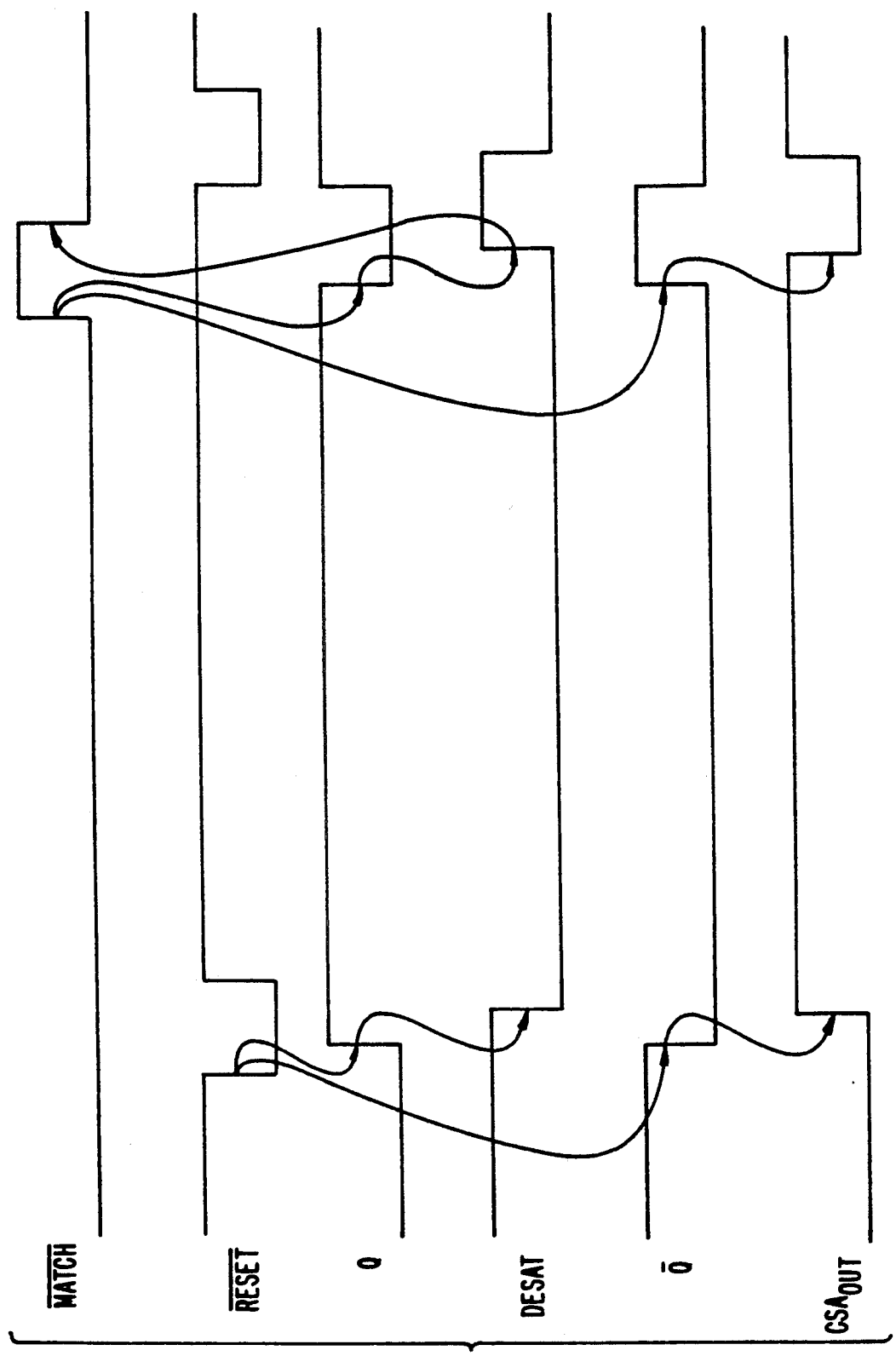
FIG. 3 is a timing chart illustrating timing relationships between the signals identified in FIG. 2.

In a CAM system where the inputs are clocked it is possible to construct a sensing circuit which responds very quickly to signals with unidirectional (falling or rising) transitions, and subsequently allows for more time to return to its untriggered state. FIG. 3 is a timing chart illustrating timing relationships between the signals identified in FIG. 2. This circuit takes advantage of this property and operates as follows: At the beginning of each cycle the RESET input signal sets high the Q output of the latch 3, thereby setting high the output of the circuit CSAout. The sense amp is designed to detect a rising transition on the $\overline{\text{match}}$ line in each case where the input to the CAM does not match the stored data in that particular CAM row (ie. when an input word matches with the contents of a particular row of the CAM, no changes will occur on that particular $\overline{\text{match}}$ line and CSAout remains high). Therefore when $\overline{\text{match}}$ rises above Vbe, the collector of the bipolar transistor 1 will pull towards ground. This will reset the output Q of the latch 3 causing a low at CSAout indicating a "no match" condition. At the same time the clamping transistor 6 is turned on which pulls the match line at the base of the bipolar transistor 1 down to ground (below Vbe) insuring that the bipolar transistor 1 is out of saturation. This clamping will not affect the output of the sense amp since that information is stored by the latch 3. Also the Q output (and not $\bar{Q}$) of the latch 3 is used followed by inverter 5 to drive the clamping transistor 6 to insure that a proper decision has been reached prior to clamping.

Figure 4:
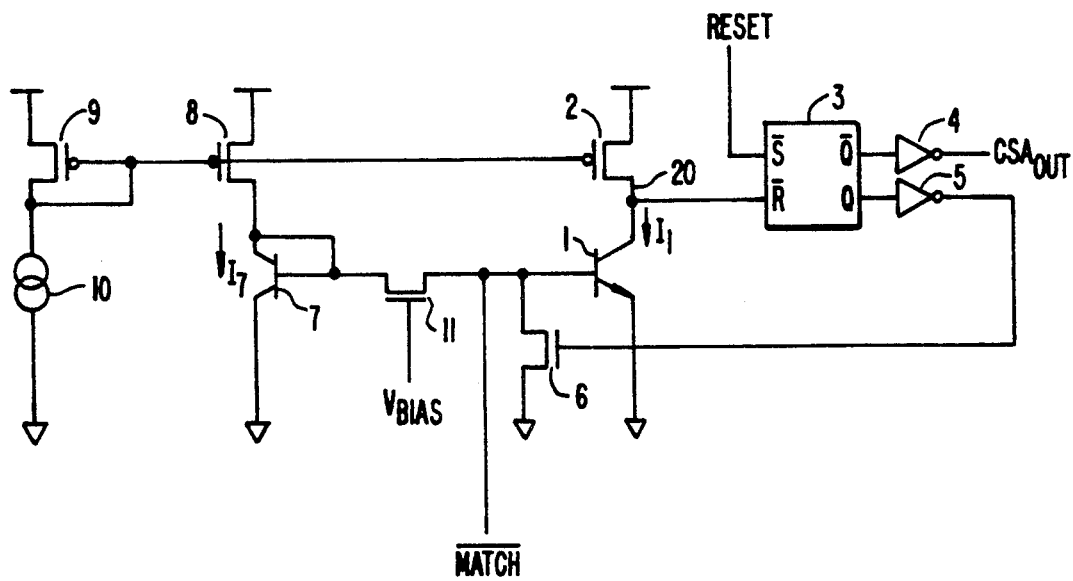
FIG. 4 is a circuit diagram of the complete sense amplifier including the desaturating and the biasing networks.

Fast switching of the bipolar transistor 1 requires the operating voltage on the match line to rise from a voltage just below Vbe to approximately a hundred millivolts above this. To maximize the voltage sensitivity of the sense amp, a biasing network in accordance with the present invention is designed as shown in FIG. 4. A base and a collector of diode-connected bipolar transistor 7 is coupled to the base of the bipolar transistor 1 via an access transistor 11, to form a current mirror circuit. The emitter of the bipolar transistor 7 is coupled to ground, while its base-collector is coupled to a drain of a P-channel MOS load transistor 8. A gate of load transistor 8 is coupled to the gate of load transistor 2, and are both coupled to a bias voltage generated by a diode-connected P-channel MOS transistor 9 and current-source 10. A gate of the access transistor 11 is coupled to a constant bias voltage Vbias.

The bipolar transistor pair 1 and 7 form a current mirror circuit where the amount of current flowing in transistor 1 (I1) is the same as that flowing through transistor 7 (I7). The desired biasing of the circuit is guaranteed by a proper ratioing of the sizes of the two load transistors 2 and 8. If they were identical in size, to the first order, the voltage at node 20 would be equal to Vbe. Given the same gate-to-source voltage for both load transistors 2 and 8, if the size of the load transistor 2 is made larger than transistor 8, the voltage at node 20 would have to rise to maintain I1 and I7 equal. Therefore, a proper ratioing of the two load transistors 2 and 8 guarantees a high voltage level at node 20, while maintaining the base of the bipolar transistor 1 (also the match line) around Vbe.

This circuit tracks changes in process parameters for the PMOS and bipolar devices. The access transistor 11 is used to isolate the bias circuit from the $\overline{\text{match}}$ line when sensing. If it weren't isolated, bipolar transistor 7 would act to clamp match. A resistor could also be used to provide some measure of isolation between the bias generator and $\overline{\text{match}}$ line. Adding this access transistor 11 does not create any problems as in the worst case, it removes charge from the $\overline{\text{match}}$ line causing node 20 to rise slightly.

In conclusion, the present invention provides an improved BICMOS content addressable memory sense amplifier with high speed, high voltage sensitivity, low power dissipation, and improved performance over temperature and process variations. While the above is a complete description of the preferred embodiments of the present invention, it is possible to use various alternatives, modification and equivalents. For example, as mentioned above, the access transistor 11 can be replaced by a resistor. Also other types of storage devices with set and reset inputs can be used in place of the RS latch 3. Therefore, the above description does not limit the scope of invention. The appended claims define this scope.

What is claimed is:

1. A sense amplifier comprising:
   a bipolar transistor with a base for receipt of a sense signal, and a collector coupled to a current-source load;
   an RS latch with a $\overline{\text{set}}$ input coupled to an input terminal for receipt of a RESET signal, a $\overline{\text{reset}}$ input coupled to said bipolar transistor collector, and an output coupled to an output of said sense amplifier; and
   a clamping transistor with a first terminal coupled to said bipolar transistor base, a second terminal coupled to a ground terminal, and a third control terminal coupled to a complementary output of said latch.

2. The sense amplifier of claim 1, further comprising:
   a diode-connected bipolar transistor with an emitter coupled to said ground terminal, and a base and a collector both coupled to said bipolar transistor base via a first and a second terminal of an access transistor with a third control terminal coupled to a bias line; and
   a second current-source load for said diode-connected bipolar transistor.

3. A sense amplifier comprising:
   a bipolar transistor with a base for receipt of a sense signal, and a collector coupled to a current-source load;
   a diode-connected bipolar transistor with an emitter coupled to a ground terminal, and a base and a collector both coupled to said bipolar transistor base via a first and a second terminal of an access transistor with a third control terminal coupled to a bias line; and a second current-source load coupled to said diode-connected bipolar transistor.

4. A sense amplifier comprising:

a bipolar transistor with a base for receipt of a sense signal, and a collector coupled to a current-source load;

an RS latch with a $\overline{\text{set}}$ input coupled to an input terminal for receipt of a RESET signal, a $\overline{\text{reset}}$ input coupled to said bipolar transistor collector, and an output coupled to an output of said sense amplifier;

a clamping transistor with a first terminal coupled to said bipolar transistor base, a second terminal coupled to a ground terminal, and a third control terminal coupled to a complementary output of said latch;

a diode-connected bipolar transistor with an emitter coupled to said ground terminal, and a base and a collector both coupled to said bipolar transistor base via a first and a second terminal of an access transistor with a third control terminal coupled to a bias line; and a second current-source load for said diode-connected bipolar transistor.

5. A BICMOS sense amplifier comprising:

a common-emitter bipolar transistor with a base for receipt of a sense signal, and an emitter coupled to a ground terminal;

a first P-channel MOS transistor, with a drain coupled to a collector of said common-emitter bipolar transistor, a source coupled to a power supply terminal, and a gate biased by a current-source voltage;

an RS latch having a $\overline{\text{set}}$ input coupled to an input terminal for receipt of a RESET signal, and a $\overline{\text{reset}}$ input coupled to said common-emitter bipolar transistor collector, wherein said latch inputs respond to a low signal;

a first inverter with an input coupled to a complementary output of said RS latch, and an output coupled to an output of said sense amplifier;

a second inverter with an input coupled to an output of said RS latch; and an N-channel MOS transistor connected as a clamping device, with a drain coupled to said common-emitter bipolar transistor base, a source coupled to said ground terminal, and a gate coupled to an output of said second inverter.

6. The BICMOS sense amplifier of claim 5, further comprising:

an MOS N-channel access transistor with a source a drain coupled to said bipolar transistor base, and a gate coupled to a bias line;

a diode-connected bipolar transistor with an emitter coupled to said ground terminal, and a base and a collector both coupled to said N-channel access transistor source; and a second P-channel MOS transistor with a drain coupled to said diode-connected bipolar transistor collector and base, a source coupled to said power supply terminal, and a gate coupled to said current-source voltage.

7. A BICMOS sense amplifier comprising:

a bipolar transistor with a base for receipt of a sense signal, and an emitter coupled to a ground terminal;

a first P-channel MOS transistor, with a drain coupled to a collector of said bipolar transistor, a source coupled to a power supply terminal, and a gate biased by a current-source voltage;

an MOS N-channel access transistor with a drain coupled to said bipolar transistor base, and a gate coupled to a bias line;

a diode-connected bipolar transistor with an emitter coupled to said ground terminal, and a base and a collector both coupled to said N-channel access transistor source; and a second P-channel MOS transistor with a drain coupled to said diode-connected bipolar transistor collector and base, a source coupled to said power supply terminal, and a gate coupled to said current-source voltage.

8. A BICMOS sense amplifier comprising:

a bipolar transistor with a base for receipt of a sense signal, and an emitter coupled to a ground terminal;

a first P-channel MOS transistor, with a drain coupled to a collector of said bipolar transistor, a source coupled to a power supply terminal, and a gate biased by a current-source voltage;

an RS latch having a $\overline{\text{set}}$ input coupled to an input terminal for receipt of a RESET signal, and a $\overline{\text{reset}}$ input coupled to said bipolar transistor collector, wherein said latch inputs respond to a low signal;

a first inverter with an input coupled to a complementary output of said RS latch, and an output coupled to an output of said sense amplifier;

a second inverter with an input coupled to an output of said RS latch;

an N-channel MOS transistor connected as a clamping device, with a drain coupled to said bipolar transistor base, a source coupled to said ground terminal, and a gate coupled to an output of said second inverter;

an MOS N-channel access transistor with a drain coupled to said bipolar transistor base, and a gate coupled to a bias line;

a diode-connected bipolar transistor with an emitter coupled to said ground terminal, and a base and a collector both coupled to said N-channel access transistor source; and a second P-channel MOS transistor with a drain coupled to said diode-connected bipolar transistor collector and base, a source coupled to said power supply terminal, and a gate coupled to said current-source voltage.

9. A method for providing a high speed BICMOS sense amplifier capable of driving full CMOS voltage levels, comprising the steps of:

sensing a rising transition of a sense signal at a base of a bipolar transistor amplifier with an emitter coupled to a ground terminal;

biasing said bipolar transistor amplifier with a P-channel current-source load transistor having a gate coupled to a current-source biase voltage;

storing an output of said bipolar transistor amplifier in an RS latch by coupling said output to a $\overline{\text{reset}}$ input of an RS latch;

initializing an output of said sense amplifier prior to each said sensing by $\overline{\text{setting}}$ said sense amplifier output responsive to a $\overline{\text{set}}$ input signal of said RS latch; and clamping said base of said bipolar transistor amplifier to a ground terminal by turning on an N-channel MOS clamping transistor, after storing said output of said bipolar transistor.

10. A method for providing a high speed, high sensitivity BICMOS sense amplifier with improved performance over temperature and process variations, comprising the steps of:

sensing a rising transition of a sense signal at a base of a bipolar transistor amplifier with an emitter coupled to a ground terminal;

biasing said bipolar transistor amplifier with a first P-channel current-source load transistor having a gate coupled to a current-source bias voltage;

storing an output of said bipolar transistor amplifier in an RS latch by coupling said output to a $\overline{\text{reset}}$ input of an RS latch;

initializing an output of said sense amplifier prior to each said sensing by setting said sense amplifier output responsive to a $\overline{\text{set}}$ input signal of said RS latch;

clamping said base of said bipolar transistor amplifier to a ground terminal by turning on an N-channel MOS clamping transistor, after storing said output of said bipolar transistor;

mirroring a collector current of said bipolar transistor amplifier by coupling said bipolar transistor amplifier base to a base and a collector of a diode-connected bipolar transistor, with said diode-connected bipolar transistor emitter coupled to said ground terminal;

coupling a collector of a second P-channel MOS load transistor to said diode-connected bipolar transistor, with a gate of said second P-channel load transistor coupled to said current-source bias voltage;

ratioing said second P-channel MOS load transistor size to said first P-channel current-source load transistor size, for raising a voltage level of said bipolar transistor amplifier collector while maintaining said bipolar transistor amplifier base voltage at a level equal to a base-emitter turn-on voltage; and isolating said bipolar transistor amplifier base from said diode-connected bipolar transistor base by coupling a channel of an N-channel MOS access transistor between said two bases, with a bias voltage controlling a gate of said access transistor.

* * * * *